United States Patent
Noguchi et al.

(10) Patent No.: US 6,509,124 B1
(45) Date of Patent: Jan. 21, 2003

(54) METHOD OF PRODUCING DIAMOND FILM FOR LITHOGRAPHY

(75) Inventors: Hitoshi Noguchi, Annaka (JP); Yoshihiro Kubota, Annaka (JP); Ikuo Okada, Shinjuku (JP)

(73) Assignees: Shin-Etsu Chemical Co., Ltd., Tokyo (JP); NTT Advanced Technology Corporation, Tokyo (JP)

( * ) Notice: Subject to any disclaimer, the term of this patent is extended or adjusted under 35 U.S.C. 154(b) by 115 days.

(21) Appl. No.: 09/705,709

(22) Filed: Nov. 6, 2000

(30) Foreign Application Priority Data

Nov. 10, 1999 (JP) .......................... 11-319874
Nov. 10, 1999 (JP) .......................... 11-319884

(51) Int. Cl.$^7$ .............................. G03F 9/00; G21K 5/00
(52) U.S. Cl. .............................................. 430/5; 378/35
(58) Field of Search ...................... 430/5, 296, 322; 378/34, 35

(56) References Cited

U.S. PATENT DOCUMENTS 5,146,481 A * 9/1992 Garg et al. .................... 378/35
5,185,179 A * 2/1993 Yamazaki et al. .......... 427/601

FOREIGN PATENT DOCUMENTS

| JP | A-61-32425 | 2/1986 |
| JP | A-64-73720 | 3/1989 |
| JP | A-2-158121 | 6/1990 |
| JP | A-4-338628 | 11/1992 |
| JP | A-9-260251 | 10/1997 |
| JP | A-11-40494 | 2/1999 |
| JP | A-2000-182947 | 6/2000 |

OTHER PUBLICATIONS

Yugo et al., *Generation of Diamond Nuclei by Electric Field in Plasma Chemical Vapor Depostion*, Appl. Pbys. Lett., pp. 1036–1038, (1991).

* cited by examiner

*Primary Examiner*—S. Rosasco
(74) *Attorney, Agent, or Firm*—Oliff & Berridge, PLC

(57) ABSTRACT

There is disclosed a method for producing a diamond film for lithography wherein a diamond film is formed on a silicon substrate on which an insulating film is formed or on an insulating substrate using a mixed gas of methane gas, hydrogen gas and oxygen gas as a raw material gas, and then the substrate is removed by etching treatment, and a method of producing a mask membrane for lithography wherein diamond particles fluidized with gas are brought into contact with a surface of a silicon substrate on which an insulating film is formed or an insulating substrate, a diamond film is grown on the substrate, and then the substrate is removed by etching treatment. There can be provided a method of producing a diamond film for lithography wherein a diamond film having high crystallinity and desired membrane stress can be formed on a substrate, and the film can be easily produced without degrading smoothness, membrane stress or the like after film formation.

8 Claims, 4 Drawing Sheets

(a)  21

(d)  23 / 22 / 21

(b)  21 / 22

(e)  23 / 22 / 21

(c)  23 / 22 / 21

(f)  23 / 22 / 21

METHOD OF PRODUCING DIAMOND FILM FOR LITHOGRAPHY

BACKGROUND OF THE INVENTION

1. Field of the Invention

The present invention relates to a method of producing a diamond film (membrane) for lithography with X-ray, electron beam, or the like.

2. Description of the Related Art

Recently, a semiconductor device has been highly accurate, and been highly integrated. In order to cope with the tendency, the pattern to be formed thereon is required to be finer, and lithography with X-ray or electron beam has been noted as a technique for realizing the requirement.

In order to form the fine patterns, an exposure apparatus has been generally used in many cases. As material for a mask membrane attached to the exposure apparatus, diamond, boron nitride, silicon nitride, silicon carbide or the like are proposed. Among them, diamond is considered to be optimal as material of a mask membrane for lithography with X-ray or electron beam, since it is excellent in Young's modulus, etching resistance, high energy ray radiation resistance, or the like.

As a method of producing a film, there have been known methods using DC arc discharge, DC glow discharge, combustion flame, high frequency, microwave, hot-filament, or the like. Among them, the microwave CVD method is excellent in reproducibility, and can provide film with high purity, and thus it has been generally used in many cases.

However, even though the diamond film is produced in accordance with the method for production, growth of the film is sometimes difficult, since a nucleus of diamond is hardly generated. In order to overcome such a problem, there is known a method of abrading a surface of a silicon substrate or conducting ultrasonic scratch, before film formation, to accelerate generation of the nuclei of diamond. However, there are problems that surface processing cannot be conducted in high evenness and uniformity nor in good reproducibility.

Furthermore, it is proposed to grow a film with accelerating generation of nuclei of diamond by applying a bias voltage to the substrate (S. Yugo, Appl, Phys. Letter, 58 (1991) 1036). However, in the method, sufficient density of nucleus generation cannot be obtained and sufficient thickness of the film cannot be obtained in some cases, and uniformity of the film is sometimes insufficient.

The film is required to have excellent characteristics such as smoothness, mechanical strength, visible light transmittance, chemical resistance, electron beam resistance, radiation resistance or the like. If a film is produced by forming a diamond film on the silicon substrate in accordance with the above-mentioned microwave CVD method, and then removing the silicon substrate by polishing, wet etching or the like, smoothness and membrane stress of the film are often degraded. Therefore, all of the above-mentioned characteristics cannot be satisfied even by the method.

In order to suppress harmful effect due to X-ray or electron beam absorption to the minimum, the membrane is required to be a free-standing film having a thickness of 0.1 to 5.0 $\mu$m. In order to form the membrane, tensile stress of the film needs to be 0.1 to $5.0 \times 10^9$ dyn/cm$^2$.

In order to obtain a film having such a tensile stress, it is known that a diamond film can be formed by a microwave CVD method, with high concentration of methane that is a raw material gas. Under the condition, sufficient tensile stress of the film can be surely achieved, but crystallinity of the film is apt to be lowered. If the film is formed with low concentration of methane in the raw material gas, good crystallinity can be achieved, but tensile stress of the film is lowered, and thus the film has compressive stress and cannot be freestanding film.

As described above, it is quite difficult to produce a film having both of sufficient crystallinity and desirable membrane stress property that are basic properties of a diamond film. The causes thereof include interference of a lot of film formation parameters, since plasma is used in film formation.

SUMMARY OF THE INVENTION

The present invention has been accomplished to solve the above-mentioned problems, and an object of the present invention is to provide a method of producing a diamond film for lithography wherein a diamond film having high crystallinity and desired membrane stress can be formed on a substrate, and the film can be easily produced without degrading smoothness, membrane stress or the like after film formation.

To solve the above-mentioned problems, the present invention relates to a method of producing a diamond film for lithography wherein a ground film is formed on a silicon substrate, a diamond film is formed on the ground film using a mixed gas of methane gas, hydrogen gas and oxygen gas as a raw material gas, and then the silicon substrate is removed by etching treatment, followed by removal of the ground film by etching treatment.

As described above, if a diamond film for lithography is formed by the method that a ground film is formed on a silicon substrate, a diamond film is formed on the ground film using a mixed gas of methane gas, hydrogen gas and oxygen gas as a raw material gas, and then the silicon substrate is removed by etching treatment, followed by removal of the ground film by etching treatment, a film can be produced without degrading smoothness, membrane stress or the like. Accordingly, a diamond film optimal as a mask membrane for lithography with X-ray or electron beam or the like can be produced.

In that case, the ground film can be made of one or more of material selected from the group consisting of silicon oxide, silicon nitride, silicon carbide, tungsten carbide, boron nitride, aluminum nitride, alumina, titanium oxide, zirconium oxide, tantalum (Ta), ruthenium (Ru), chromium (Cr) and tungsten (W). Among them, silicon oxide, silicon nitride and silicon carbide are excellent in film-forming property, mechanical strength, visible light transmittance, and are preferable. Formation of the ground film can be conducted in accordance with a known method such as a spattering method, a reduced pressure CVD method, or the like.

Furthermore, according to the present invention, there is provided a method of producing a diamond film for lithography comprising forming a diamond film using a mixed gas of methane gas, hydrogen gas and oxygen gas as a raw material gas on a ground substrate, removing the substrate by etching treatment.

As described above, a film can also be produced without degrading smoothness, membrane stress or the like by the method comprising forming a diamond film using a mixed gas of methane gas, hydrogen gas and oxygen gas as a raw material gas on a ground substrate, removing the substrate by etching treatment, so that a diamond film optimal as a mask membrane for lithography with X-ray or electron beam or the like can be produced.

In that case, the ground substrate can be made of one or more of material selected from the group consisting of silicon oxide, silicon nitride, silicon carbide, tungsten carbide, boron nitride, aluminum nitride, alumina, titanium oxide, zirconium oxide, tantalum (Ta), ruthenium (Ru), chromium (Cr) and tungsten (W). Among them, silicon oxide, silicon nitride and silicon carbide are preferable.

In that case, etching of the above-mentioned silicon substrate is conducted with an alkaline aqueous solution, and etching of the above-mentioned ground film or the ground substrate is conducted with an acidic aqueous solution, to form a diamond film for lithography.

As described above, if the above-mentioned silicon substrate is etched with an alkaline aqueous solution and the ground film or the ground substrate is etched with an acidic aqueous solution, the substrate or the ground film can be surely removed by etching treatment, and the diamond film is never eroded by the alkaline aqueous solution. Accordingly, the diamond film can be surely and easily produced without degrading smoothness, membrane stress or the like.

If one or more of material selected from the group consisting of silicon oxide, silicon nitride, silicon carbide, tungsten carbide, boron nitride, aluminum nitride, alumina, titanium oxide, zirconium oxide, tantalum (Ta), ruthenium (Ru), chromium (Cr) and tungsten (W) is used as the above-mentioned ground film and the ground substrate as described above, the ground film and the ground substrate can be easily removed by etching treatment without damaging the diamond film, so that smoothness, membrane stress or the like of the resulting diamond film is not degraded.

According to the present invention, a diamond film is formed using a raw material gas comprising 0.1 to 20% by volume of methane gas, 70 to 99.89% by volume of hydrogen gas, 0.01 to 10% by volume of oxygen gas.

As described above, if the raw material gas comprising 0.1 to 20% by volume of methane gas, 70 to 99.89% by volume of hydrogen gas, 0.01 to 10% by volume of oxygen gas is used, high crystallinity can be maintained, and a diamond film having high tensile stress can be formed, even under the subtle condition that methane gas is diluted with hydrogen gas.

In that case, a diamond film is preferably formed with a microwave CVD method or a hot filament CVD method, keeping the temperature of the surface of the substrate at 700° C. to 1200° C.

As described above, if a diamond film is formed with a microwave CVD method or a hot filament CVD method, keeping the temperature of the surface of the substrate at 700° C. to 1200° C., tensile stress of the film can be easily controlled, so that desired tensile stress can be surely achieved without degrading crystallinity, and thus a diamond film suitable for lithography with X-ray, electron beam or the like can be produced.

The present invention also relates to a method of producing a mask membrane for lithography wherein a ground film is formed on a silicon substrate, diamond particles fluidized with gas are brought into contact with the surface of the ground film, a diamond film is then grown on the ground film, and subsequently the silicon substrate is removed by etching treatment, followed by removal of the ground film by etching treatment.

As described above, if a mask membrane for lithography is produced by the method wherein a ground film is formed on the silicon substrate, diamond particles fluidized with gas are brought into contact with on the surface of the ground film, a diamond film is then grown on the ground film, and subsequently the silicon substrate is removed by etching treatment, followed by removal of the ground film by etching treatment, a film can be produced without degrading smoothness, membrane stress or the like. Accordingly, a diamond film optimal as a mask membrane for lithography with X-ray or an electron beam or the like can be produced.

In that case, the ground film can be made of one or more of material selected from the group consisting of silicon oxide, silicon nitride, silicon carbide, tungsten carbide, boron nitride, aluminum nitride, alumina, titanium oxide, zirconium oxide, tantalum (Ta), ruthenium (Ru), chromium (Cr) and tungsten (W). Among them, silicon oxide, silicon nitride and silicon carbide are excellent in diamond film-forming property, mechanical strength, visible light transmittance, and are preferable. Formation of the ground film can be conducted in accordance with a known method such as a spattering method, a reduced pressure CVD method, or the like.

The present invention also relates to a method of producing a mask membrane for lithography wherein diamond particles fluidized with gas are brought into contact with the surface of a ground substrate, a diamond film is then grown, and subsequently the substrate is removed by etching treatment.

As described above, the film can also be produced without degrading smoothness, membrane stress or the like by the method wherein diamond particles fluidized with gas are brought into contact with the surface of a ground substrate, a diamond film is then grown, and subsequently the substrate is removed by etching treatment. Accordingly, a diamond film optimal as a mask membrane for lithography with X-ray or electron beam or the like can be produced.

In that case, the ground substrate can be made of one or more of material selected from the group consisting of silicon oxide, silicon nitride, silicon carbide, tungsten carbide, boron nitride, aluminum nitride, alumina, titanium oxide, zirconium oxide, tantalum (Ta), ruthenium (Ru), chromium (Cr) and tungsten (W). Among them, silicon oxide, silicon nitride and silicon carbide are preferable.

In that case, it is preferable that etching of the above-mentioned silicon substrate is conducted with an alkaline aqueous solution, and etching of the above-mentioned ground film or the ground substrate is conducted with an acidic aqueous solution, to form a diamond film for lithography.

As described above, if the above-mentioned silicon substrate is etched with an alkaline aqueous solution and the ground film or the ground substrate is etched with an acidic aqueous solution, the film is never eroded by the alkaline aqueous solution. Accordingly, the film can be surely and easily produced without degrading smoothness, membrane stress or the like.

If one or more of material selected from the group consisting of silicon oxide, silicon nitride, silicon carbide, tungsten carbide, boron nitride, aluminum nitride, alumina, titanium oxide, zirconium oxide, tantalum (Ta), ruthenium (Ru), chromium (Cr) and tungsten (W) is used as the above-mentioned ground film and the ground substrate as described above, the ground film and the ground substrate can be easily removed by etching treatment without damaging the surface of the diamond film, so that smoothness, membrane stress or the like of the resulting diamond film is not degraded.

According to the present invention, a diamond film having high crystallinity and desired membrane stress can be formed on the substrate, and a diamond film for lithography with X-ray or electron beam can be produced without degrading smoothness or membrane stress or the like after film formation.

DESCRIPTION OF THE INVENTION AND A PREFERRED EMBODIMENT

The present invention will be further described below in detail, but is not limited thereto.

The inventors found that a diamond film having high crystallinity and desired membrane stress can be formed on the substrate and a diamond film can be produced without degrading smoothness, membrane stress or the like after film formation, if a diamond film is formed using a mixed gas of methane gas, hydrogen gas and oxygen gas as a raw material gas, and then the substrate is removed by etching treatment, to complete the present invention. Examples of a method for forming a film include a microwave CVD method, hot filament CVD method, DC arc discharge method, DC glow discharge method, high frequency heating method, or the like. Among them, a microwave CVD method, a hot filament CVD method is preferable.

Figure 1:
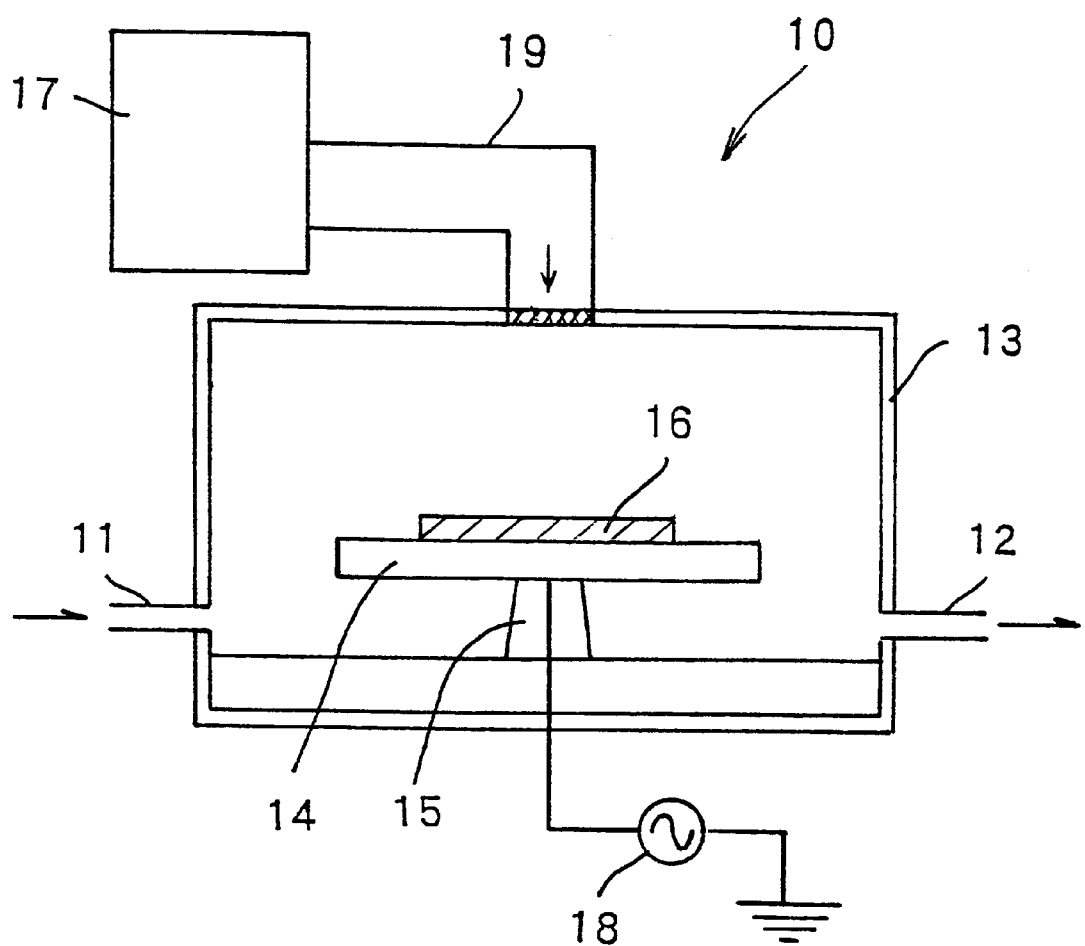
FIG. 1 is a schematic view of a microwave CVD apparatus used in the method for production of the present invention.

FIG. 1 shows one example of microwave CVD apparatuses used for forming a diamond film on a substrate according to the present invention.

Figure 2:
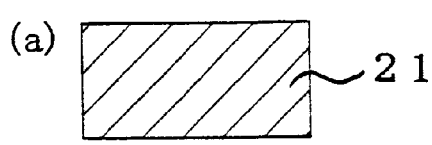
FIGS. 2(a)–(f) shows an example of a process for producing a diamond film for lithography of the present invention.
Figure 2:
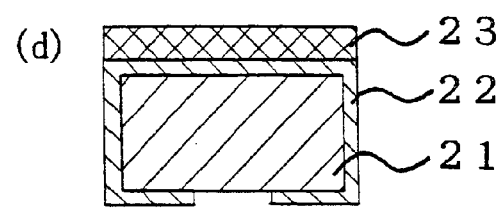
Figure 2:
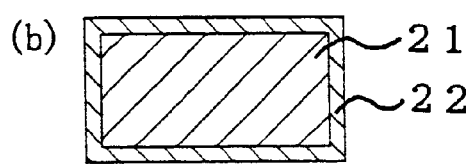
Figure 2:
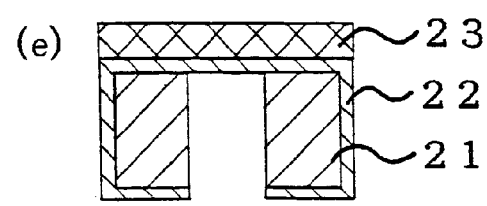
Figure 2:
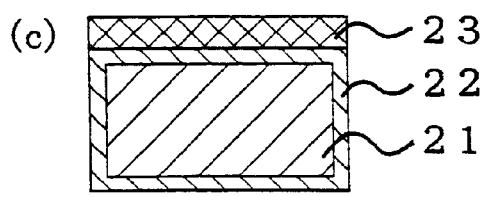
Figure 2:
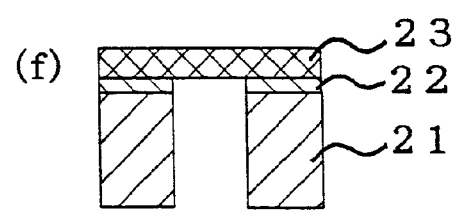

FIG. 2 shows one example of processes for producing a diamond film for lithography according to the present invention.

The present invention relates to a method of producing a diamond film for lithography wherein a ground film is formed on a silicon substrate, a diamond film is formed on the ground film using a mixed gas of methane gas, hydrogen gas and oxygen gas as a raw material gas, and then the silicon substrate is removed by etching treatment from the back side, followed by removal of the ground film by etching treatment.

First, a method for forming a diamond film according to a microwave CVD method is explained, referring to FIG. 1.

As shown in FIG. 1, in a microwave CVD apparatus 10, a substrate stage 15 equipped with heating means 14 such as a heater or the like is located in a chamber 13 equipped with a gas inlet pipe 11 and a gas outlet pipe 12. Microwave source 17 is connected to a microwave introducing window with waveguide 19 so that plasma can be generated in a chamber 13.

A diamond film is formed using the above-mentioned apparatus according to a microwave CVD method as follows.

A substrate 16 on which a diamond film is to be formed is placed on the substrate stage 15, pressure in the chamber 13 is reduced using a rotary pump to be $10^{-3}$ Torr or less, to be evacuated. Then, a mixed gas of methane gas, hydrogen gas and oxygen gas is supplied at a desired flow from the gas inlet pipe 11. Then, a bulb of the gas outlet pipe 12 is adjusted to make a pressure in the chamber 13 30 Torr. A microwave is applied to the introduced gas to generate plasma in the Chamber 13, and form a diamond film on the substrate 16.

The surface of the substrate can also be treated with diamond particles fluidized or the like in order to make generation of diamond nuclei easy as described later.

The reaction gas to be introduced in the chamber 13 is a mixed gas of methane gas, hydrogen gas and oxygen gas. The ratio thereof is preferably as follows: 0.1% to 20% by volume of methane gas, 70% to 99.89% by volume of hydrogen gas, 0.01% to 10% by volume of oxygen gas, for example, as shown in Japanese Patent Application Laid-open (Kokai) No.11-40494. With such a volume ratio, a diamond film having high crystallinity and sufficient tensile stress can be formed. Preferable range is as follows: 1% to 10% by volume of methane gas, 85% to 98.9% by volume of hydrogen gas, 0.1% to 5% by volume of oxygen gas. With such a range, a diamond film having high crystallinity and high tensile stress can be surely formed.

In that case, in order to afford necessary tensile stress to a diamond film, the diamond film is produced with heating a substrate 16 on which a diamond film is formed using the above-mentioned heating means 14, and controlling the temperature. Examples of the heating means 14 include a sintered SiC heater, a CVD-SiC heater or the like.

Tensile stress of a diamond film is preferably in the range of 0.1 to 5.0×$10^9$ dyn/cm$^2$, more preferably 0.3 to 3.0×$10^9$ dyn/cm$^2$. In that case, thickness of the film is preferably 0.1 to 5.0 μm, especially 0.2 to 3.0 μm.

If thickness and tensile stress of a diamond film are in the above-mentioned range, the film can be formed as a free-standing film, and surely used as a membrane for lithography with X-ray, electron beam or the like.

Temperature of the substrate on which a diamond film is to be formed is preferably 700° C. to 1200° C., since if it is more than 1200° C., crystallinity of the film is lowered in some cases. If it is formed in the above-mentioned temperature range, membrane stress can be surely and easily controlled without degrading crystallinity.

The above-mentioned range of temperature can be achieved by controlling electric power of microwave to be applied. However, physical property of a diamond film to be deposited is sometimes unstable in that case. Accordingly, it is preferable that the temperature is controlled also with the above-mentioned heating means 14 for heating the substrate. Physical property such as stress or the like of the resulting diamond film can be controlled to be a desired value by controlling the temperature of the substrate during film formation using the heating means 14.

Then, a method for obtaining a membrane by forming a diamond film on the substrate according to the above-mentioned microwave CVD method and then removing the substrate by etching treatment will be explained, referring to FIG. 2.

First, a diamond film 23 is formed on the silicon substrate 21 on which a ground film 22 is formed, according to the above-mentioned method (See FIGS. 2(a) to (c)).

Then, a part of the ground film 22 is removed (FIG. 2(d)) by etching treatment using an acid aqueous solution such as aqueous solution of hydrofluoric acid at a predetermined area of back surface of the substrate on which a diamond film 23 is formed (FIG. 2(c)). Then, the silicon substrate 21 is removed by etching treatment with an alkaline aqueous solution such as an aqueous solution of potassium hydroxide at 95° C. to the ground film 22 (FIG. 2(e)).

In that case, the silicon substrate 21 is etched with an aqueous solution of potassium hydroxide, etching treatment can be easily terminated when etching reaches the ground film 22, since etching rate of the ground film 22 is slow.

Then, a diamond film for lithography can be obtained by subsequently removing the ground film 22 using an acid aqueous solution such as an aqueous solution of hydrofluoric acid (FIG. 2(f)).

According to the above-mentioned method, the diamond film is hardly eroded by hydrofluoric acid. Accordingly, the membrane for lithography with X-ray or electron beam can be surely and easily produced without degrading smoothness or membrane stress.

Then, the case that the substrate is removed by etching treatment after the diamond film is formed on the ground substrate is specifically explained as follows.

First, a diamond film is formed on a ground substrate as described above. Then, the predetermined area of the back surface of the ground substrate on which a film is formed is removed by etching treatment with an acidic aqueous solution such as hydrofluoric acid aqueous solution or the like until etching reaches a diamond film. Thereby, a diamond film for lithography can be obtained.

According to this method, a diamond film for lithography with X-ray, electron beam or the like can be surely and easily produced without degrading smoothness, membrane stress or the like, since an alkaline aqueous solution is not used by which a diamond film is apt to be eroded.

The method for removal with an etching solution can be a conventional method. For example, it is conducted by dipping the substrate on which a diamond film is formed according to the above-mentioned method in a bath containing an etchant.

The substrate on which a diamond film is formed is a substrate obtained by forming a ground film on a silicon substrate or a ground substrate. The ground film and the ground substrate preferably consist of one or more material selected from the group consisting of silicon oxide, silicon nitride, silicon carbide, tungsten carbide, boron nitride, aluminum nitride, alumina, titanium oxide, zirconium oxide, tantalum (Ta), ruthenium (Ru), chromium (Cr) and tungsten (W). Among them, silicon oxide, silicon nitride and silicon carbide are preferable.

These materials for the ground film or the like can be selected from the above material so that a difference may be made in etching rate of a diamond film, a silicon substrate, and a ground film. Thereby, a diamond film can be easily formed on a substrate, and the substrate is easily removed by etching treatment, so that smoothness, membrane stress or the like of the resulting diamond film is not degraded.

According to the present invention, if a diamond film is grown on a silicon substrate on which a ground film is formed or a ground substrate, the surface of the diamond film is not damaged with removal of the substrate in an etching process of the silicon substrate with an alkaline aqueous solution. Accordingly, the state of the surface of the membrane is good, and generation of defective products having uneven film thickness and membrane stress can be prevented, resulting in improvement in yield.

Then, the another embodiment of the present invention will be explained as follows.

The another embodiment of the present invention relates to a method for producing a mask membrane for lithography by forming a ground film on the silicon substrate, subjecting the ground film to the treatment for accelerating generation of diamond nuclei during film formation, to form a diamond film. Then, a silicon substrate is removed by etching treatment; a ground film is subsequently removed by etching treatment.

According to the present invention, a mask membrane for lithography can be easily produced without degrading smoothness, membrane stress or the like of the diamond film by using a difference in etching rate between a diamond film and a substrate in an etching process, when a mask membrane for lithography is produced by forming a diamond film on a substrate and removing the substrate by etching treatment.

Figure 3:
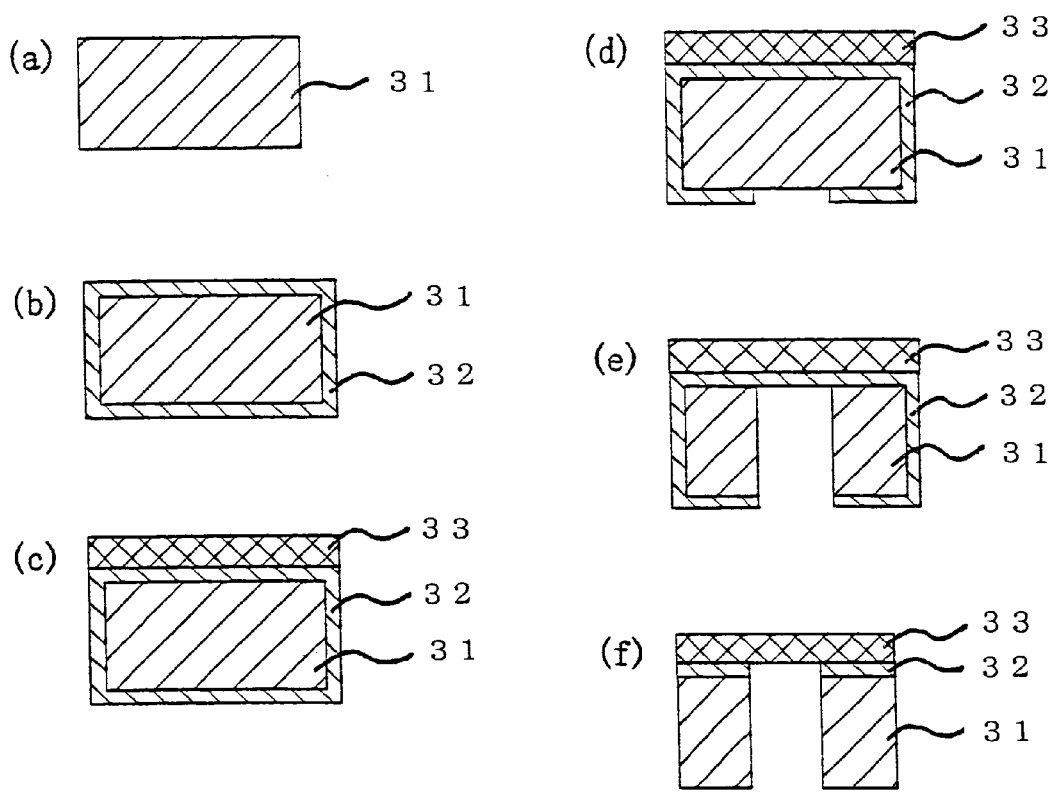
FIGS. 3(a)–(f) shows an example of a process for producing a mask membrane for lithography of the present invention.

A method for producing a mask membrane for lithography with X-ray or electron beam by etching a substrate on which a diamond film is formed to remove it will be explained below, referring to FIG. 3.

First, the method wherein a diamond film 33 is formed on the silicon substrate 31 on which a ground film 32 is formed, and then the substrate is removed by etching treatment will be specifically explained.

A part of a ground film 32 on the back surface of the substrate on which a diamond film 33 is formed (FIG. 3(c)) is removed by etching treatment with an acidic aqueous solution such as hydrofluoric acid aqueous solution (FIG. 3(d)). Then, the silicon substrate 31 is removed by etching treatment with alkaline aqueous solution such as aqueous solution of potassium hydroxide at 95° C. to the ground film 32 (FIG. 3(e)).

In that case, although silicon is etched with aqueous solution of potassium hydroxide, the etching treatment can be easily terminated when the etching reaches the ground film, since etching rate of the ground film is slow.

Then, the ground film 32 is removed by etching treatment with an acidic aqueous solution such as hydrofluoric acid aqueous solution (FIG. 3(f)) to form a membrane consisting of a diamond film.

According to the above method, a diamond film is hardly eroded by hydrofluoric acid, so that a membrane for lithography with X-ray or electron beam can be surely and easily produced without degrading smoothness, membrane stress or the like.

Next, the case that a diamond film is formed on the ground substrate, and the substrate is removed by etching treatment will be specifically explained below.

A membrane consisting of a diamond film can be obtained by etching a predetermined area of the ground substrate on which a film is formed with an acidic aqueous solution such as hydrofluoric acid aqueous solution to a diamond film.

According to the above method, a membrane for X-ray or electron beam lithography can be surely and easily produced, without degrading smoothness, membrane stress or the like, since an alkaline aqueous solution is not used by which a diamond film is apt to be eroded.

A method for removing by etching treatment can be a conventional method. For example, it can be conducted by dipping the substrate on which a diamond film is formed according to the above-mentioned method in a bath containing an etchant.

As described above, if a diamond film is formed on a silicon substrate on which a ground film is formed or a ground substrate, the surface of the diamond film is not damaged with removal of the substrate in a etching process of the silicon substrate with alkaline aqueous solution. Accordingly, the state of the surface of the film is good, and generation of defective products having uneven thickness and membrane stress of the film can be prevented, resulting in improvement in yield.

Then, a method for bringing fluidized diamond particles into contact with a silicon substrate on which a ground film is formed or a ground substrate before formation of a diamond film can be conducted in accordance with, for example, a method described in Japanese Patent Application Laid-open (Kokai) No.9-260251.

Figure 4:
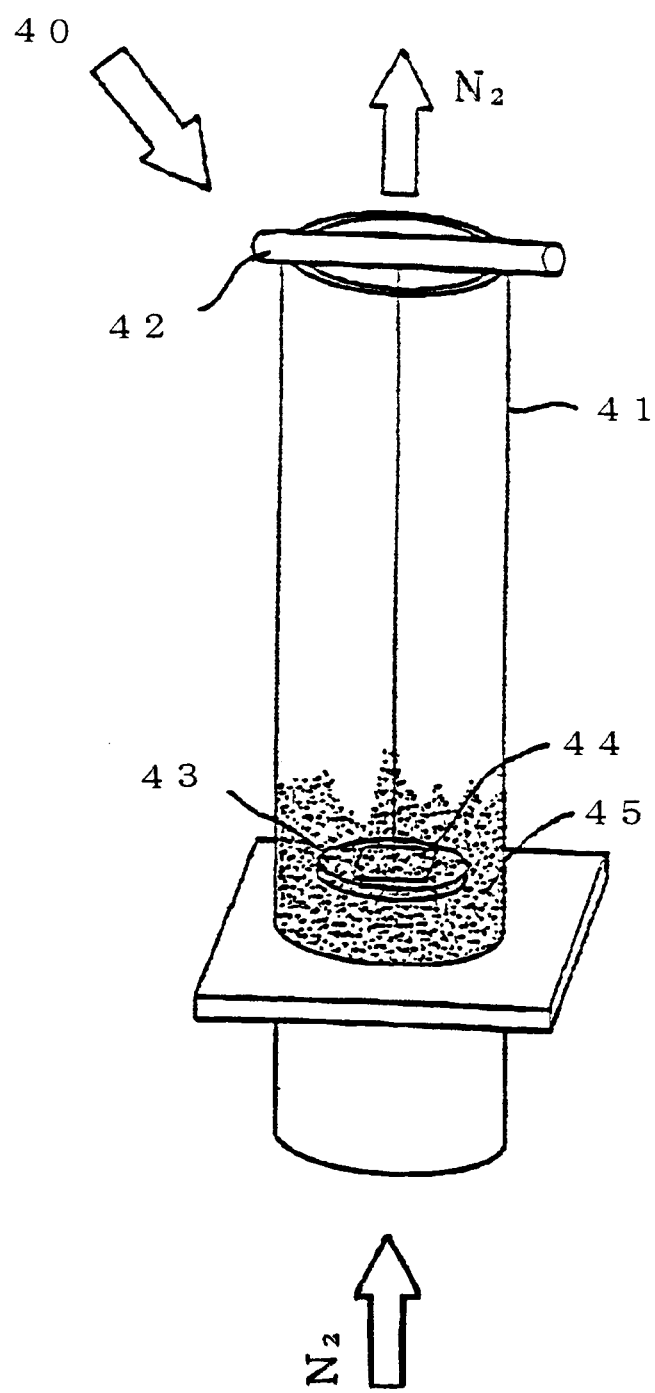
FIG. 4 is a schematic view of an apparatus for diamond particle fluidizing treatment used in the present invention.

As shown in FIG. 4, in an apparatus for fluidizing diamond particles 40, there are located in a treatment chamber 41, a wire netting made of stainless steel 43 is fixed with a fixing jig 42, and a silicon substrate on which a ground film is formed or a ground substrate 44 is located thereon, so that the diamond particles 45 can be fluidized with inert carrier gas such as nitrogen or the like introduced from underneath via the wire netting made of stainless steel 43. The fluidized diamond particles 45 are brought into contact with the surface of the substrate 44, so that the surface of the substrate 44 may have a flaw, or diamond particles may remain thereon, to accelerate generation of diamond nuclei during film formation.

As described above, if diamond particles are allowed to collide with the substrate, flaws and diamond particles can be adhered on the substrate uniformly and efficiently, compared with conventional polishing or ultrasonic scratch. The flaws and diamond particles accelerate generation of diamond nuclei and, the film can be grown easily and evenly in a layer state when a diamond film is formed on the substrate treated as above. Thereby, uniform thickness of the film and membrane stress can be achieved.

In order to make flaws or adhere diamond particles uniformly on the substrate, the state of fluidization of the particles are preferably made constant, and a treatment chamber 41 has preferably sufficient size to a substrate. For example, in order to treat the substrate having a diameter of 4 inches, a treatment chamber is preferably in the shape of a cylinder having inner diameter of about 8 inches.

Particle size of the diamond particle is preferably defined depending on the size of the substrate or the like, in the range of 0.1 $\mu$m to 700 $\mu$m. Kinds of diamond can be synthetic or natural.

The gas for fluidizing diamond particles is flown at a rate preferably 5 times or more as fast as the rate at the beginning of gas fluidizing, and is preferably flown constantly and in an opposite direction to a direction of gravity in the treatment chamber.

The minimum fluidizing velocity Umf can be calculated from the following equation (1), when Archimedes number is $1.9 \times 10^4$ or less.

$$Umf = dp^2 (\rho p - \rho f) G / 1650 \mu \quad (1)$$

In the equation (1), dp represents a particle size of a diamond particle, $\rho p$ represents a density of diamond particles, $\rho f$ represents gas flow density, G represents gravitational acceleration, $\mu$ represents a viscosity. Units are given in the CGS system.

If the rate of gas for fluidizing diamond particles is less than the rate five times as fast as the minimum fluidizing velocity, a sufficient fluidized layer cannot be always achieved. If the rate of the gas is more than the rate 100 times as fast as the minimum fluidizing velocity, the fluidized layer is sometimes broken. Accordingly, the rate is preferably 5 to 100 times as fast as the minimum fluidizing velocity.

The fluidized gas to be used may be gas that is easily handled and does not cause chemical reaction on the surface of the substrate. Namely, inert gas is preferable. Examples of the gas include nitrogen, argon or the like.

The substrate 44 placed on the wire netting made of stainless steel 43 can be fixed on the wire netting, or can be floated thereon. In either case, it is preferable that it is placed vertically to a gas flow in order to be uniformly treated.

The density of generation of diamond nuclei is preferably $1 \times 10^6$ number/mm$^{-2}$ or more. If it is less than $1 \times 10^6$ number/mm$^{-2}$, thickness of the resulting membrane gets uneven. Accordingly, the above-mentioned range is preferable.

A method for forming a diamond film on the substrate can be a conventional method. Examples of the method include methods using DC arc discharges DC glow discharge, combustion flame, high frequency, microwave, hot-filament or the like. It is desirable to conduct by the microwave CVD method, since the reproducibility thereof is excellent, and impurities are never mixed therein.

EXAMPLE

The following examples and comparative examples are being submitted to further explain the present invention.

Example 1

A double side polished silicon wafer (100) 21 having a diameter of 3 inches and a thickness of 2 mm was prepared as shown in FIG. 2(a). Then, on the surface thereof, a silicon nitride film 22 having a thickness of 0.5 $\mu$m was formed according to a reduced pressure CVD method (FIG. 2(b)).

Before the diamond film 23 was formed on the silicon substrate 21 on which the silicon nitride film 22 was formed, the surface of the silicon nitride film 22 was treated with fluidized diamond particles in order to make generation of diamond nuclei easy.

After the above-mentioned treatment, the diamond film 23 was formed on the silicon substrate 21 on which the silicon nitride film 22 was formed (FIG. 2(c)).

The diamond film 23 was formed using a microwave CVD apparatus shown in FIG. 1 as follows.

The silicon substrate 21 on which the silicon nitride film 22 (insulating film) of which surface was treated was formed was placed on the heating means 14, evacuation was conducted by reducing air pressure to $10^{-3}$ Torr or less through use of a rotary pump, and then a mixed gas of methane gas, hydrogen gas and oxygen gas was supplied thereto from the gas inlet pipe 11. Each of gasses was supplied so that methane gas was 45.0 sccm, hydrogen gas was 945.0 sccm and oxygen gas was 10.0 sccm. The volume ratio thereof was methane gas/hydrogen gas/oxygen gas=4.5/94.5/1.0. Then, the pressure in the chamber 13 was controlled to be 30 Torr by controlling a bulb of the gas outlet pipe 12, and a microwave having a electric power of 3000 W was applied thereto to generate plasma, and film formation of the diamond film on the substrate was conducted for 37 hours.

Although the substrate was not heated during film formation, temperature of the surface of the substrate was 860° C.

The resulting diamond film 23 had a thickness of 3.0 $\mu$m and was polycrystalline diamond. A membrane stress of the diamond film was $0.4 \times 10^9$ dyn/cm$^2$ as a tensile stress as calculated from the warp of the substrate.

Then, the back surface of the substrate on which a diamond film was formed by the above-mentioned method (FIG. 2(c)) was masked with a resin film at a part other than 30 mm square part at a center, and then a part of the silicon nitride film 22 was etched with an aqueous solution of hydrofluoric acid (FIG. 2(d)). Then, the silicon substrate 21 was etched with an aqueous solution of potassium hydroxide at 95° C. to the silicon nitride film 22 (FIG. 2(e)). In that case, although the silicon 21 is etched with the aqueous solution of potassium hydroxide, etching treatment can be easily terminated when etching reaches the silicon nitride film 22, since the etching rate of the silicon nitride film 22 is slow. Then, the silicon nitride film 22 was subsequently etched with an aqueous solution of hydrofluoric acid (FIG. 2(f)) to provide a diamond film for lithography. The etched surface of the resulting film had no corrosion and was excellent in smoothness. Example 2

The diamond film was formed on the substrate according to the microwave CVD method under the same condition as Example 1 except that a ground substrate (insulating substrate) consisting of silicon nitride with a diameter of 3 inches and a thickness of 2 mm was used as a substrate. Thereby, a polycrystalline diamond film having a thickness of 3.0 $\mu$m was obtained. A membrane stress was $2.5 \times 10^9$ dyn/cm$^2$ as a tensile stress.

The part other than the 30 mm square part at a center of the back surface of the substrate on which the film was formed was masked with a resin film, and the ground substrate was removed by etching with hydrofluoric acid to provide a diamond film for lithography. The etched surface of the resulting film had no corrosion and was excellent in smoothness.

Comparative Examples 1 to 3

In each of Comparative Examples 1 and 2, a diamond film for lithography was produced under the same condition as Example 1 except that a ratio by volume of the mixed gas and film-forming time were as shown in Table 1.

In Comparative Example 3, a diamond film for lithography was produced under the same condition as Example 1 except that a silicon wafer (100) was used alone as a substrate, film-forming time was 35 hours, the substrate was etched only with an aqueous solution of potassium hydroxide.

The results were summarized in Table 1.

As shown in Table 1, a membrane having a satisfactory diamond film could not be obtained in Comparative Examples under any conditions.

Especially, when a silicon was used as a substrate, and only an alkaline aqueous solution was used as an etchant as in Comparative Example 3, the surface of a diamond film formed on the silicon substrate was eroded with an alkaline aqueous solution during etching process, so that smoothness and membrane stress of a diamond film was degraded.

Example 3

As shown in FIG. 3(a), double side polished silicon wafer (100) 31 having a diameter of 4 inches and a thickness of 600 $\mu$m was prepared, and silicon nitride film 32 having a thickness of 0.5 $\mu$m was formed thereon according to a reduced pressure CVD method (FIG. 3(b)). Then, the above-mentioned substrate was subjected to treatment with diamond particles through use of a diamond particle fluidizing apparatus shown in FIG. 4.

An acrylic tube having a inner diameter of 8 inches and a height of 1 m was used as a treatment chamber. 700 g of Synthetic diamond having an average particle size of 400 $\mu$m was used as diamond particles. The wire netting made of stainless steal having a size of 40 $\mu$m was used, through which nitrogen as a fluidizing gas was introduced from underneath. The nitrogen gas was introduced at a rate of 366 cm/sec that is 20 times as fast as Umf 18.3 cm/sec. The silicon substrate 31 on which silicon nitride film 32 was formed was fixed near the center of the treatment chamber so that the surface to be treated may be vertical to the gas flow. The treatment was conducted for three hours.

After the above-mentioned treatment, the diamond film 33 was formed on the silicon substrate 31 on which the silicon nitride film 32 was formed (FIG. 3(C)).

The diamond film was formed according to a microwave CVD method, which will be described below.

First, the above-mentioned treated substrate was placed in the chamber, hydrogen and methane as raw material gas was introduced respectively at 997 cc/minute, 3 cc/minute under the condition of reduced pressure of $10^{-3}$ Torr or less. Then, the pressure in the chamber was increased to 30 Torr, and microwave of 3000 W was applied to conduct film formation for 30 hours. The temperature of the surface of the substrate was 890° C.

TABLE 1

| | Microwave power (kW) | Raw material gas CH$_4$/H$_2$/O$_2$ (% by volume) | Film forming time (hrs) | Film thickness ($\mu$m) | Crystallinity | Tensile Stress | Formation of membrane | smoothness of etched surface after formation of membrane |
|---|---|---|---|---|---|---|---|---|
| Example 1 | 3 | 4.5/94.5/1.0 | 37 | 3.0 | good | $0.4 \times 10^9$ | possible | good |
| Example 2 | 3 | 4.5/94.5/1.0 | 37 | 3.0 | good | $2.5 \times 10^9$ | possible | good |
| Comparative Example 1 | 3 | 4.6/95.4/0 | 20 | 3.0 | no good | $0.08 \times 10^9$ | possible | good |
| Comparative Example 2 | 3 | 30.0/59.0/11.0 | 37 | no film formation | — | — | impossible | — |
| Comparative Example 3 | 3 | 4.5/94.5/1.0 | 35 | 3.0 | good | $1.5 \times 10^9$ | possible | no good* |

*a lot of point corrosion

The resulting diamond film 33 consisted of polycrystalline diamond having a thickness of 1.1 $\mu$m. The density of nucleus generation of the diamond film 33 was $1.2 \times 10^8$/mm, $1.5 \times 10^8$/mm, $1.6 \times 10^8$/mm respectively at positions of 7 mm, 23 mm and 39 mm from the edge of the substrate. Accordingly, it was found that the film was extremely close and uniform.

Then, the part other than 30 mm square part at a center of the back surface of the substrate on which a diamond film was formed by the above-mentioned method (FIG. 3(c)) was masked with a resin film, and then a part of the ground film 32 was etched with an aqueous solution of hydrofluoric acid (FIG. 3(d)). Then, the silicon substrate 31 was etched with an aqueous solution of potassium hydroxide at 95° C. to the ground film 32 (FIG. 3(e)). In that case, although the silicon 31 is etched with the aqueous solution of potassium hydroxide, etching treatment can be easily terminated when etching reached the silicon nitride film 32, since the etching rate of the silicon nitride is slow. Then, the ground film 32 was subsequently etched with an aqueous solution of hydrofluoric acid (FIG. 3(f)) to provide a membrane consisting of diamond film for lithography. In that case, the diamond film was hardly eroded by an aqueous solution of hydrofluoric acid. Accordingly, the membrane had no corrosion and was excellent in uniformity.

Example 4

The diamond particle fluidizing treatment was conducted under the same condition as Example 3 except that the ground substrate consisting of silicon nitride and having a diameter of 4 inches and a thickness of 600 μm was used as a substrate. Then, the diamond film was formed on the substrate according to a microwave CVD method, to provide a polycrystalline diamond having a thickness of 1.2 μm. The density of nucleus generation of the diamond film was $1.6 \times 10^8$/mm, $2.0 \times 10^8$/mm, $2.0 \times 10^8$/mm respectively at positions of 7 mm, 23 mm and 39 mm from the edge of the substrate. Accordingly, it was found that the film was extremely close and uniform.

Then, the part other than 30 mm square part at a center of the back surface of the substrate on which a diamond film was formed was masked with a resin film, and then the ground substrate was etched with an aqueous solution of hydrofluoric acid to a diamond film to provide membrane consisting of a diamond film. The membrane had no corrosion due to an etchant and was excellent in uniformity.

Comparative Example 4

The diamond particle fluidizing treatment and formation of the diamond film were conducted on the double side polished silicon wafer (100) having a diameter of 4 inches and a thickness of 600 μm according to the same method as Example 3 except that the silicon nitride film was not formed.

The resulting diamond film was polycrystalline diamond having a thickness of 1.5 μm. The density of nuclei generation of the resulting diamond film was $2.5 \times 10^8$/mm, $3.1 \times 10^8$/mm, $3.4 \times 10^8$/mm respectively at positions of 7 mm, 23 mm and 39 mm from the edge of the substrate. Accordingly, it was found that the film was extremely close and uniform.

Then, the part other than 30 mm square part at a center of the back surface of the substrate on which a film was formed was masked with a resin film, and then the silicon substrate was etched with an aqueous solution of potassium hydroxide at 95° C., to provide a membrane consisting of a diamond film. The etched surface of the resulting membrane had a lot of point corrosion and was apparently uneven.

Comparative Example 5

Ultrasonic oscillation was applied to a double side polished silicon wafer (100) having a diameter of 4 inches and a thickness of 600 μm for 40 minutes in hexane in which synthetic diamond particles having an average particle size of 1 μm were dispersed.

The diamond film was formed in a similar manner to Example 3 on the substrate of which surface was treated by above method. The resulting diamond film was polycrystalline diamond having a thickness of 1.0 μm. The density of nuclei generation of the resulting diamond film was $6.2 \times 10^3$/mm, $9.2 \times 10^3$/mm, $8.5 \times 10^3$/mm respectively at positions of 7 mm, 23 mm and 39 mm from the edge of the substrate. Namely, the density was extremely low and uneven.

Then, the part other than 30 mm square part at a center of the back surface of the substrate on which a film was formed was masked with a resin film, and then the silicon substrate was etched with an aqueous solution of potassium hydroxide at 95° C., to provide a membrane consisting of a diamond film. The etched surface of the resulting membrane had a lot of point corrosion and was apparently uneven.

The present invention is not limited to the above-described embodiment. The above-described embodiment is a mere example, and those having the substantially same structure as that described in the appended claims and providing the similar action and effects are included in the scope of the present invention.

What is claimed is:

1. A method for producing a diamond film for lithography wherein a ground film is formed on a whole surface of a silicon substrate, a diamond film is formed on the ground film using a mixed gas of methane gas, hydrogen gas and oxygen gas as a raw material gas, and then a part of the ground film of a back surface is removed by etching treatment, the silicon substrate is removed by etching treatment, followed by removal of the ground film by etching treatment.

2. The method for production according to claim 1 wherein the ground film is made of one or more of material selected from the group consisting of silicon oxide, silicon nitride, silicon carbide, tungsten carbide, boron nitride, aluminum nitride, alumina, titanium oxide, zirconium oxide, tantalum (Ta), ruthenium (Ru), chromium (Cr) and tungsten (W).

3. The method for production according to claim 1 wherein etching of the silicon substrate is conducted with an alkaline aqueous solution, and etching of the ground film or the ground substrate is conducted with an acidic aqueous solution.

4. The method for production according to claim 1 wherein the raw material gas comprising 0.1 to 20% by volume of methane gas, 70 to 99.89% by volume of hydrogen gas, 0.01 to 10% by volume of oxygen gas is used.

5. The method for production according to claim 1 wherein the film formation is conducted by a microwave CVD method or a hot filament CVD method, keeping a temperature of a surface of the substrate at 700° C. to 1200° C.

6. A method for producing a mask membrane for lithography wherein a ground film is formed on a whole surface of a silicon substrate, diamond particles fluidized with gas are brought into contact with a surface of the ground film, a diamond film is grown on the ground film, and then a part of the ground film of a back surface is removed by etching treatment, the silicon substrate is removed by etching treatment, followed by removal of the ground film by etching treatment.

7. The method for production according to claim 6 wherein the ground film is made of one or more of material selected from the group consisting of silicon oxide, silicon nitride, silicon carbide, tungsten carbide, boron nitride, aluminum nitride, alumina, titanium oxide, zirconium oxide, tantalum (Ta), ruthenium (Ru), chromium (Cr) and tungsten (W).

8. The method for production according to claim 6 wherein etching of the silicon substrate is conducted with an alkaline aqueous solution, and etching of the ground film or the ground substrate is conducted with an acidic aqueous solution.

* * * * *